United States Patent
Wu et al.

(10) Patent No.: US 10,097,184 B2
(45) Date of Patent: Oct. 9, 2018

(54) DIFFERENTIAL RECEIVER

(71) Applicant: NXP USA, Inc., Austin, TX (US)

(72) Inventors: Xiaowen Wu, Shanghai (CN); Lei Tian, Shanghai (CN); Yongqin Liang, Shanghai (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/447,646

(22) Filed: Mar. 2, 2017

(65) Prior Publication Data

US 2018/0054198 A1    Feb. 22, 2018

(30) Foreign Application Priority Data

Aug. 17, 2016 (CN) ............... 2016 1 0680799

(51) Int. Cl.
| | |
|---|---|
| H03L 5/00 | (2006.01) |
| H03K 19/0175 | (2006.01) |
| H01L 27/146 | (2006.01) |
| G11C 16/06 | (2006.01) |
| H03M 1/12 | (2006.01) |
| H03F 3/45 | (2006.01) |
| H03K 19/0185 | (2006.01) |
| H03K 5/08 | (2006.01) |

(52) U.S. Cl.
CPC ....... H03K 19/018521 (2013.01); H03K 5/08 (2013.01)

(58) Field of Classification Search
CPC ............. H03K 19/018521; H03K 5/08; H03K 19/0175; H03L 5/00; H03F 3/45

USPC .................. 326/62, 63, 68, 80, 81; 327/333; 365/189.11; 1/1
See application file for complete search history.

(56) References Cited

U.S. PATENT DOCUMENTS

| | | | |
|---|---|---|---|
| 6,686,778 B2 | 2/2004 | Theogarajan | |
| 6,775,186 B1* | 8/2004 | Eshel | G11C 16/28 365/185.2 |
| 6,946,904 B1 | 9/2005 | Varma et al. | |
| 2012/0326753 A1* | 12/2012 | Jao | H03K 5/2472 327/89 |
| 2015/0022264 A1* | 1/2015 | Kim | G01R 31/2851 330/2 |
| 2015/0070969 A1* | 3/2015 | Hatsuda | G11C 13/004 365/148 |
| 2017/0352696 A1* | 12/2017 | Panicacci | H01L 27/14643 |

OTHER PUBLICATIONS

Kim, Moon-Jung et al; "High-Voltage-Tolerant I/O Circuit Design for USB 2.0—Compliant Applications"; 2007 IEEE Custom Integrated Circuits Conference, San Jose, CA, US; pp. 491-494 (Sep. 16-19, 2007).

* cited by examiner

*Primary Examiner* — Brandon S Cole

(57) ABSTRACT

One example discloses A differential receiver, including: a set of high voltage differential inputs configured to receive a first range of differential voltages; a first level shifter configured to generate a second range of differential voltages that are less than the first range of differential voltages; and a first low voltage differential comparator coupled to the first level shifter and configured to generate a first differential receiver output based on the second range of differential voltages.

16 Claims, 2 Drawing Sheets

DIFFERENTIAL RECEIVER

CROSS-REFERENCE TO RELATED APPLICATIONS

This application claims the priority under 35 U.S.C. § 119 of China patent application no. 201610680799.2, filed Aug. 17, 2016 the contents of which are incorporated by reference herein.

The present specification relates to systems, methods, apparatuses, devices, articles of manufacture and instructions for differential signal reception.

As integrated circuits (IC) and processes continue to scale aggressively, a maximum allowed voltage that an IC transistor can endure is also decreasing.

SUMMARY

According to an example embodiment, a differential receiver, comprising: a set of high voltage differential inputs configured to receive a first range of differential voltages; a first level shifter configured to generate a second range of differential voltages that are less than the first range of differential voltages; and a first low voltage differential comparator coupled to the first level shifter and configured to generate a first differential receiver output based on the second range of differential voltages.

In another example embodiment, the first level shifter includes a set of MOSFETs whose gate-source voltages are configured to reduce the first range of differential voltages to less than the second range of differential voltages.

In another example embodiment, the first and second first low voltage differential comparators operate at a voltage which is less than a signal range of the high voltage differential inputs.

In another example embodiment, further comprising a set of voltage clamps; and wherein the voltage clamps are configured to limit a voltage received by at least one of the differential comparators.

In another example embodiment, the differential receiver is embedded in at least one of: a USB connector, or a USB-Type C connector.

In another example embodiment, further comprising: a second level shifter coupled to the first level shifter and configured to generate a third range of differential voltages that are less than the second range of differential voltages.

In another example embodiment, further comprising: a second low voltage differential comparator coupled to the second level shifter and configured to generate a second differential receiver output based on the second range of differential voltages.

In another example embodiment, the first and second differential receiver outputs are combined into a single differential receiver output.

In another example embodiment, the first and second differential receiver outputs are combined in parallel into the single differential receiver output.

In another example embodiment, the high voltage differential inputs are configured to carry signals having a maximum voltage greater than or equal to 3.6V.

In another example embodiment, the low voltage differential comparators are configured to carry signals having a maximum voltage less than or equal to 1.8V.

In another example embodiment, a common mode voltage range of the set of high voltage differential inputs varies from 0.8V to 2.5V.

In another example embodiment, the first differential receiver output is configured to output digital binary signals.

According to an example embodiment, a differential receiver, comprising: means for receiving a first range of differential voltages; means for generating a second range of differential voltages that are less than the first range of differential voltages; and means for generating a first differential receiver output based on the second range of differential voltages.

According to an example embodiment, a receiving method within a differential receiver having: a set of high voltage differential inputs; a first level shifter coupled to the set of differential inputs; and a first low voltage differential comparator coupled to the first level shifter, the method comprising: receiving a first range of differential voltages; generating a second range of differential voltages that are less than the first range of differential voltages; and generating a first differential receiver output based on the second range of differential voltages.

In another example embodiment, the first level shifter includes a pair of diode connected MOS devices biased with equal current source and configured to level shift down the differential voltages without reducing a differential amplitude of the differential voltages.

According to an example embodiment, low voltage tolerant transistors are used to receive high voltage differential signal with small differential amplitude and wide common mode voltage range on the data bus.

In another example embodiment, detailed configuration is given, which use low voltage tolerant transistors receive high voltage differential signal with small differential amplitude and wide common mode voltage range on the data bus.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings, in which:

Figure 1:
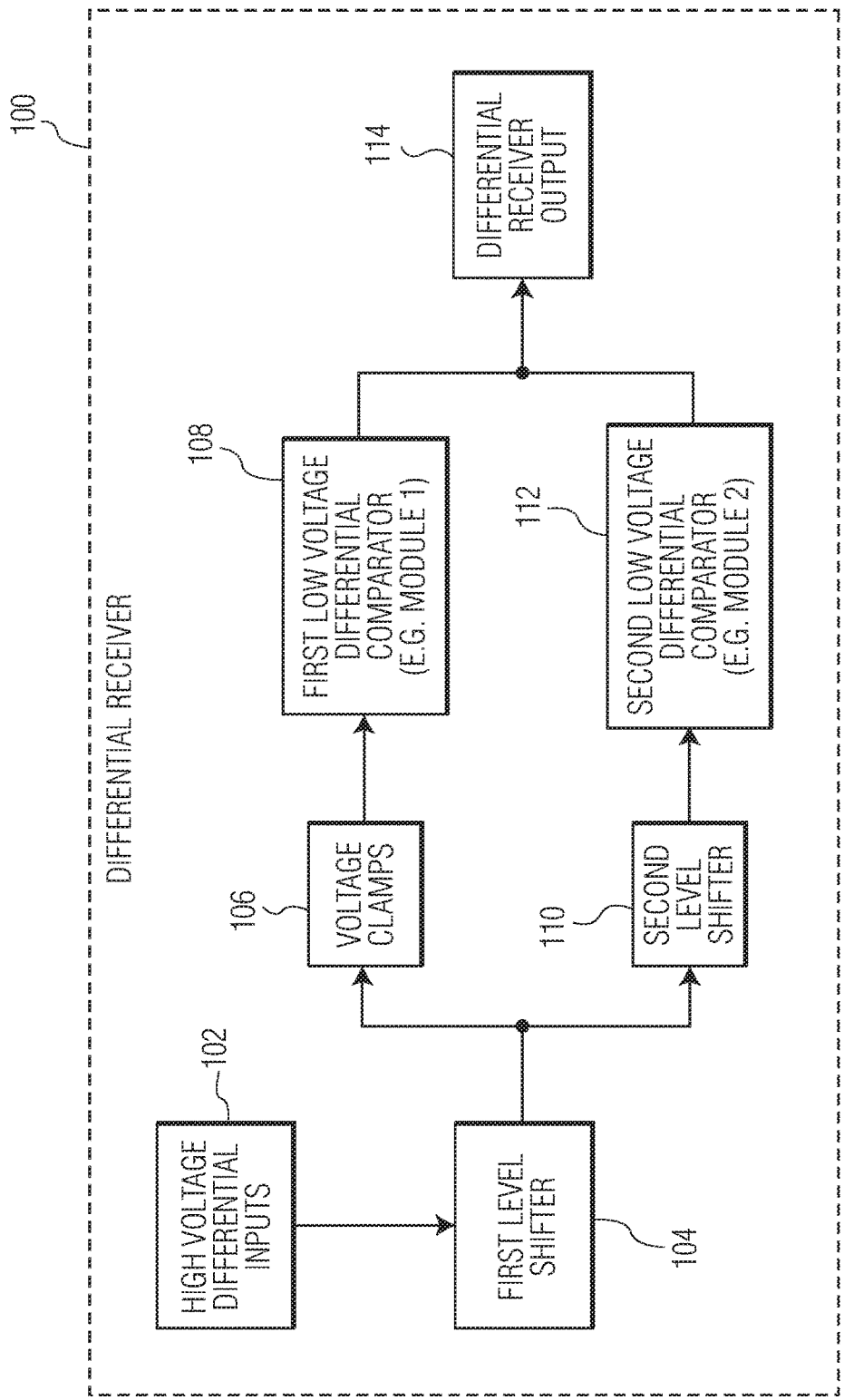
FIG. 1 is a first example of a differential receiver.

While the disclosure is amenable to various modifications and alternative forms, specifics thereof have been shown by way of example in the drawings and will be described in detail. It should be understood, however, that other embodiments, beyond the particular embodiments described, are, possible as well. All modifications, equivalents, and alternative embodiments falling within the spirit and scope of the appended claims are covered as well.

DETAILED DESCRIPTION

FIG. 1 is a first example 100 of a differential receiver.
The first differential receiver 100 includes a high voltage differential inputs 102, a first level shifter 104, voltage clamps 106, a first low voltage differential comparator 108 (e.g. module 1), a second level shifter 110, a second low voltage differential comparator 112 (e.g. module 2) and a differential receiver output 114.

In one example, the high voltage differential inputs 102 receive a first range of differential voltages (e.g. 0V to 3.6V).

The differential inputs 102 are coupled to the first level shifter 104.

The first level shifter 104 is configured to operate at a voltage provided by the high voltage differential inputs 102. The first level shifter 104 generates a second range of differential voltages that are less than the first range of differential voltages (e.g. 0V to 2.5V) while preserving their differential amplitude. In one example, this voltage reduction is caused by the diode connected PMOS transistor gate-source or gate-drain voltage drops within the first level shifter 104.

The first level shifter 104 is then coupled to a set of voltage clamps 106 and a second level shifter 110.

The voltage clamps 106 include voltage-limiting pass transistors which limit an input voltage at the first low voltage differential comparator 108 (e.g. comp_1) in case the output of the first level shifter 104 is still higher than permissible voltage ranges for the first low voltage differential comparator 108.

The voltage clamps 106 thus protect the transistors in the first low voltage differential comparator 108 (e.g. comp_1) from being overstressed by high voltage from the high voltage differential inputs 102 (e.g. from the input pads).

The first low voltage differential comparator 108 (e.g. comp_1) receives the differential signals from the first level shifter 104 via the voltage clamps 106.

The first low voltage differential comparator 108 (e.g. comp_1) senses those differential inputs whose common mode voltage can pass through the voltage clamps 106 without distortion. These common mode voltage of the differential inputs are at a relatively lower voltage since they are shifted down in voltage by only the first level shifter 104.

The second level shifter 110 is configured to generate a third range of differential voltages that are less than the second range of differential voltages and thus further reduces the voltage level on the differential voltage inputs 102.

Because of both the first and second level shifters 104, 110, the second low voltage differential comparator 112 (e.g. comp_2) can sense the high voltage differential inputs 102 with a higher end common mode voltage range. These higher end common mode input voltages would have been clamped by the voltage clamps 106, thereby protecting the first low voltage differential comparator 108 from being destroyed by the higher end common mode input voltages. In other example embodiments, additional differential comparators can be added, such as for sensing the differential inputs 102 having a middle level common mode voltage range.

Outputs from the first and second low voltage differential comparators 108, 112 (e.g. comp_1, comp_2) are connected together to sum in parallel at the differential receiver output 114. In one example embodiment the voltages on the differential receiver output 114 are in a digital binary signal form.

Figure 2:
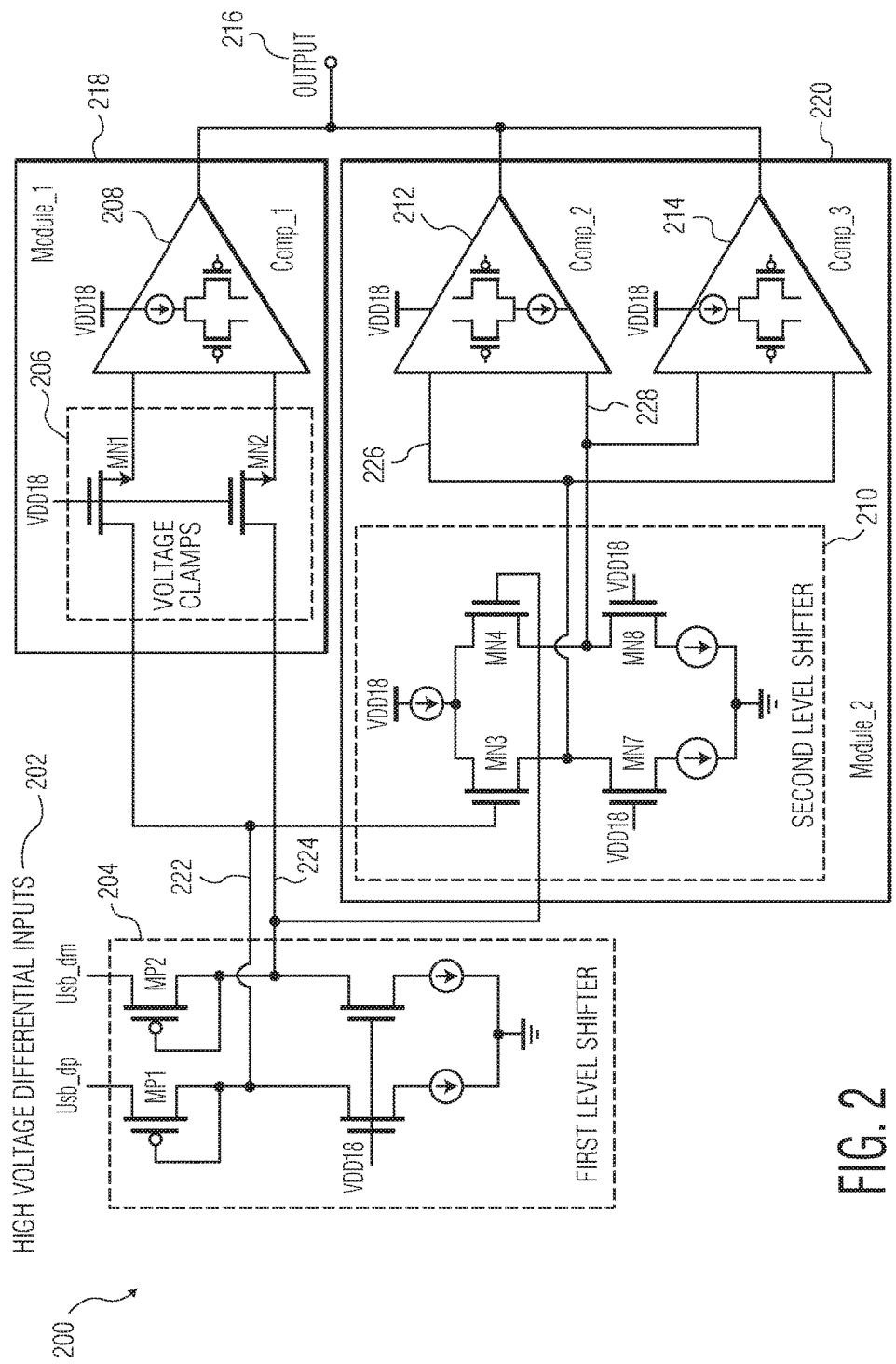
FIG. 2 is a second example of a differential receiver.

FIG. 2 is a second example 200 of a differential receiver.

The second differential receiver 200 includes a high voltage differential inputs 202, a first level shifter 204, voltage clamps 206, a first low voltage differential comparator 208 (e.g. comp_1), a second level shifter 210, a second low voltage differential comparator 212 (e.g. comp_2), a third low voltage differential comparator 214 (e.g. comp_3), a differential receiver output 216, a module_1 218, a module_2 220, a first PMOSFET drain 222, a second PMOSFET drain 224, a first NMOSFET source 226, and a NMOSFET source 228.

In one example, the high voltage differential inputs 202 (i.e. USB_dp and USB_dm, also known as the USB input pads) receive voltages in a 0V to 3.6V range.

The differential inputs 202 are coupled to the first level shifter 204.

The first level shifter 204 is a diode-connected PMOSFET (MP1 and MP2). PMOSFETs MP1 and MP2 are biased with equal current source.

The drains 222, 224 of the PMOSFETs MP1 and MP2 are connected to two parallel modules module_1 218 and module_2 222.

At the drains 222, 224 the PMOSFETs MP1 and MP2 have shifted down the voltages at the high voltage differential inputs 202 by VGSp (i.e. the gate-source voltage of the PMOSFETs).

Module_1 218 and module_2 220 are both are supplied in this example by 1.8V, in contrast to the 3.6V received at the high voltage differential inputs 202.

In this example, module_1 218 includes the voltage clamps 206 and the first low voltage differential comparator 208 (e.g. comp_1).

The voltage clamps 206 includes NMOS voltage-limiting pass transistors (NMOSFETs MN1 and MN2 whose gates are biased at VDD18). VDD18 is in this example indicative of a VDD of 1.8 Volts.

The voltage clamps 206 (MN1 and MN2) limit the input voltage at the first low voltage differential comparator 208 (e.g. comp_1) to VDD18 minus Vth, even if the drains of MP1 and MP2 are higher than VDD18−Vth, where Vth is the threshold turn-on voltage of the MOSFET.

The voltage clamps 206 thus protect the transistors in the first low voltage differential comparator 208 (e.g. comp_1) from being overstressed by high voltage from the high voltage differential inputs 202 (e.g. from the input pads) which might be higher than VDD18.

The first low voltage differential comparator 208 (e.g. comp_1) receives the differential signals from the drains of MP1 and MP2 via the voltage clamps 206. In this example, the first low voltage differential comparator 208 (e.g. comp_1) includes PMOSFETs.

The first low voltage differential comparator 208 (e.g. comp_1) senses those differential voltage inputs which can pass through the voltage clamps 206 (MN1 and MN2) without distortion. The common mode voltage of the differential inputs is at a relatively lower voltage since they are shifted down in voltage by only the first level shifter 204 and can be sensed by the first low voltage differential comparator 208 (e.g. comp_1), which is a PMOS input comparator.

In this example, module_2 220 includes the second level shifter 210 and the second and third low voltage differential comparators 212, 214 (e.g. comp_2, comp_3).

The second level shifter 210 includes a pair of source follower (MN3 and MN4) NMOSFETs. MN3 and MN4 are biased with a same current source.

The second level shifter 210 further shifts the voltage level of the differential voltage inputs from the drains 222, 224 of MP1 and MP2 by VGSn.

Thus the voltage level of the differential voltage inputs at the sources 226, 228 of MN3 and MN4 are in the range which the second and third low voltage differential comparators 212, 214 (e.g. comp_2, comp_3) supplied by VDD18 (i.e. 1.8V) can sense.

The second low voltage differential comparator 212 (e.g. comp_2) includes NMOSFETs and can sense a higher common mode input range.

The third low voltage differential comparator 214 (e.g. comp_3) include PMOSFETs, which can sense a lower common mode input range.

The sources of MN3 and MN4 in the second level shifter 210 are coupled with the differential inputs to the second and third low voltage differential comparators 212, 214 (e.g. comp_2, comp_3).

The two times VGS voltage drop, from both the first and second level shifters 204, 210, thus enables the second and third low voltage differential comparators 212, 214 (e.g. comp_2, comp_3) to sense those differential inputs 202 (USB_dp and USB_dm) with higher level and middle level common mode voltage which would be distorted by the voltage clamps 206 (MN1 and MN2). In the example, Comp_2 with NMOS input pairs can sense high level, comp_3 with PMOS input pairs can sense the middle level.

Outputs from the first, second, and third low voltage differential comparators 208, 212, 214 (e.g. comp_1, comp_2, comp_3) are connected together and summed in parallel at the differential receiver output 216. In one example embodiment the voltages on the differential receiver output 216 range from 0V to 1.8V and are in a digital binary signal form.

Various embodiments of the differential receiver 200 can sense a 200 mV differential signal, over a large common mode range (e.g. from 0.8V to 2.5V) using 1.8V tolerant CMOS technology. Thus, low voltage (e.g. 1.8V) tolerant transistors can be used to implement various USB PHY functions, having a 0~3.6V differential input signal range.

The first and second differential receivers 100, 200, in various example embodiments, can be embedded in: a USB full speed differential receiver, a USB connector, a USB-Type C connector, or another other receiver which needs to sense a low differential amplitude and cover a wide common mode voltage range.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A differential receiver, comprising:
a set of high voltage differential inputs configured to receive a first range of differential voltages;
a first level shifter configured to generate a second range of differential voltages that are less than the first range of differential voltages;
a first low voltage differential comparator coupled to the first level shifter and configured to generate a first differential receiver output based on the second range of differential voltages; and
a set of voltage clamps coupled between the first level shifter and the first low voltage differential comparator and configured to limit the second range of differential voltages received by the first low voltage differential comparator.

2. The differential receiver of claim 1, wherein the first level shifter includes a set of MOSFETs whose gate-source voltages are configured to reduce the first range of differential voltages to less than the second range of differential voltages.

3. The differential receiver of claim 1, wherein the first low voltage differential comparator operates at a voltage which is less than a signal range of the high voltage differential inputs.

4. The differential receiver of claim 1, wherein the set of voltage clamps is a set of voltage-limiting pass transistors.

5. The differential receiver of claim 1, wherein the differential receiver is embedded in at least one of a USB connector or a USB-Type C connector.

6. The differential receiver of claim 1, further comprising:
a second level shifter coupled to the first level shifter and configured to generate a third range of differential voltages that are less than the second range of differential voltages.

7. The differential receiver of claim 6, further comprising:
a second low voltage differential comparator coupled to the second level shifter and configured to generate a second differential receiver output based on the second range of differential voltages.

8. The differential receiver of claim 7, wherein the first and second differential receiver outputs are combined into a single differential receiver output.

9. The differential receiver of claim 8, wherein the first and second differential receiver outputs are combined in parallel into the single differential receiver output.

10. The differential receiver of claim 1, wherein the high voltage differential inputs are configured to carry signals having a maximum voltage greater than or equal to 3.6V.

11. The differential receiver of claim 1, wherein the low voltage differential comparators are configured to carry signals having a maximum voltage less than or equal to 1.8V.

12. The differential receiver of claim 1, wherein a common mode voltage range of the set of high voltage differential inputs varies from 0.8V to 2.5V.

13. The differential receiver of claim 1, wherein the first differential receiver output is configured to output digital binary signals.

14. The differential receiver of claim 1, wherein the first level shifter includes a pair of diode connected MOS devices biased with equal current source and configured to level shift down the differential voltages without reducing a differential amplitude of the differential voltages.

15. A differential receiver, comprising:
a set of high voltage differential inputs configured to receive a first range of differential voltages;
a level shifter configured to generate a second range of differential voltages that are less than the first range of differential voltages; and
a low voltage differential comparator configured to generate a first differential receiver output based on the second range of differential voltages; and
a set of voltage clamps coupled between the level shifter and the low voltage differential comparator and configured to limit the second range of differential voltages received by the low voltage differential comparator.

16. A receiving method within a differential receiver having a set of high voltage differential inputs, a first level shifter coupled to the set of differential inputs, and a first low voltage differential comparator coupled to the first level shifter, the method comprising:
receiving, with a set of high voltage differential inputs, a first range of differential voltages;
generating, with a level shifter, a second range of differential voltages that are less than the first range of differential voltages;
generating, with a low voltage differential comparator, a first differential receiver output based on the second range of differential voltages; and
limiting, with a set of voltage clamps coupled between the first level shifter and the first low voltage differential comparator, the second range of differential voltages received by first low voltage differential comparator.

* * * * *